USO11991887B2

United States Patent
Wang et al.

(10) Patent No.: US 11,991,887 B2
(45) Date of Patent: May 21, 2024

(54) THREE-DIMENSIONAL MEMORY

(71) Applicant: Taiwan Semiconductor Manufacturing Company, Ltd., Hsinchu (TW)

(72) Inventors: Chenchen Jacob Wang, Hsinchu (TW); Chun-Chieh Lu, Taipei (TW); Yi-Ching Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 584 days.

(21) Appl. No.: 17/313,254

(22) Filed: May 6, 2021

(65) Prior Publication Data

US 2022/0359569 A1 Nov. 10, 2022

(51) Int. Cl.
| | |
|---|---|
| *H10B 51/40* | (2023.01) |
| *G11C 11/22* | (2006.01) |
| *G11C 16/08* | (2006.01) |
| *H01L 23/522* | (2006.01) |
| *H10B 43/27* | (2023.01) |
| *H10B 43/40* | (2023.01) |
| *H10B 51/20* | (2023.01) |
| *H10B 43/10* | (2023.01) |
| *H10B 51/10* | (2023.01) |

(52) U.S. Cl.
CPC .......... *H10B 51/40* (2023.02); *G11C 11/2255* (2013.01); *G11C 16/08* (2013.01); *H01L 23/5226* (2013.01); *H10B 43/27* (2023.02); *H10B 43/40* (2023.02); *H10B 51/20* (2023.02); *H10B 43/10* (2023.02); *H10B 51/10* (2023.02)

(58) Field of Classification Search
CPC ........ H10B 51/40; H10B 43/27; H10B 43/40; H10B 43/10; H10B 51/10; G11C 11/2255; G11C 16/08; G11C 2213/71; H01L 23/5226
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |

(Continued)

*Primary Examiner* — David Vu
*Assistant Examiner* — Brandon C Fox
(74) *Attorney, Agent, or Firm* — McClure, Qualey & Rodack, LLP

(57) ABSTRACT

Three-dimensional memories are provided. A three-dimensional memory includes a memory cell array, a first interconnect structure, a bit line decoder and a second interconnect structure. The bit line decoder is formed under the memory cell array and the first interconnect structure. The memory cell array includes a plurality of memory cells formed in a plurality of levels stacked in a first direction. The first interconnect structure includes at least one bit line extending in a second direction that is perpendicular to the first direction. The bit line includes a plurality of sub-bit lines stacked in the first direction. Each of the sub-bit lines is coupled to the memory cells that are arranged in a line in the corresponding level of the memory cell array. The second interconnect structure is configured to connect the bit line to the bit line decoder passing through the first interconnect structure.

20 Claims, 12 Drawing Sheets

(56) References Cited

U.S. PATENT DOCUMENTS

| | | | |
|---|---|---|---|
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2016/0064088 A1* | 3/2016 | Shiga | G11C 16/3445 |
| | | | 365/185.17 |
| 2021/0091108 A1* | 3/2021 | Naruke | G11C 16/24 |
| 2022/0328524 A1* | 10/2022 | Huang | H01L 23/5226 |

\* cited by examiner

THREE-DIMENSIONAL MEMORY

BACKGROUND

A recent trend in semiconductor memories is to fabricate three-dimensional (3D) integrated circuits (3D IC). 3D ICs include a variety of structures, such as die on silicon interposer, stacked dies, multi-tiered, stacked CMOS structures, and the like. These 3D circuits offer a host of advantages over traditional two dimensional circuits: lower power consumption, higher memory cell density, greater efficiency, alleviating bottlenecks, shorter critical path delays, and lower area cost to name just a few.

Shrinking the cell size and increasing density for memory is eagerly needed for various applications, e.g., embedded memory or standalone memory. Therefore, it is important to have a memory with a small size and a high density.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
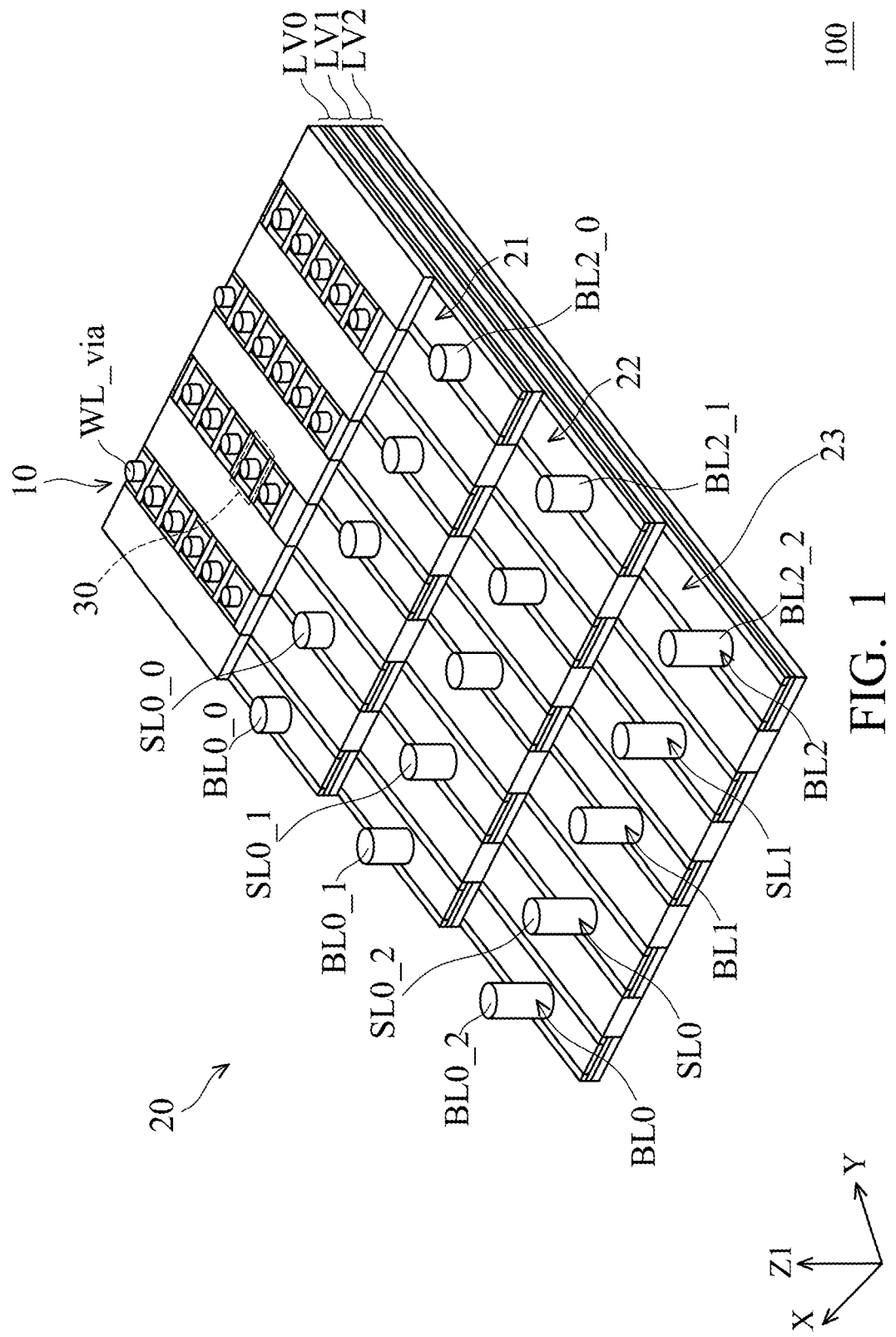
FIG. 1 shows a three-dimensional (3D) memory, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 shows a three-dimensional (3D) memory 100, in accordance with some embodiments of the disclosure. The three-dimensional memory 100 includes a memory cell array 10. The memory cell array 10 is multi-level (or multi-layer) structure, and the memory cell array 10 includes multiple memory cells 30 arranged in each level of the multi-level structure. In some embodiments, the number of memory cells 30 in the levels are the same. In some embodiments, the three-dimensional memory 100 may be a ferroelectric RAM, a NOR flash and so on.

The three-dimensional memory 100 further includes an interconnect structure 20, and the interconnect structure 20 is configured to provide multiple bit lines BL and multiple source lines SL to the memory cell array 10. In some embodiments, the interconnect structure 20 may be a staircase having multiple stairs, and each stair is coupled to respective level in the memory cell array 10. It should be noted that the number of levels and the number of memory cells 30 in the memory cell array 10 are used as an example and not to limit the discloser.

The bit lines BL and the source lines SL are arranged so that they extend in the Y direction, i.e., the bit lines BL are parallel to the source line SL. Furthermore, the bit lines BL (e.g., BL0-BLk and k=2) and the source lines SL (e.g., SL0-SL(k−1) and k=2) are coupled to the memory cell array 10 through the interconnect structure 20. It should be noted that the number of bit lines BL and the number of source lines SL in the interconnect structure 20 are used as an example and not to limit the discloser.

In FIG. 1, the bit line BL0 may include the sub-bit lines BL0_0 to BL0_2, and each of sub-bit lines BL0_0 to BL0_2 is arranged in respective stair of the interconnect structure 20, so as to couple the memory cells 30 in the corresponding level of the memory cell array 10. Similarly, the bit line BL1 may include the sub-bit lines BL1_0 to BL1_2, and each of sub-bit lines BL1_0 to BL1_2 is arranged in the respective stair of the interconnect structure 20, so as to couple the memory cells 30 in the corresponding level of the memory cell array 10. Furthermore, the bit line BL2 may include the sub-bit lines BL2_0 to BL2_2, and each of sub-bit lines BL2_0 to BL2_2 is arranged in the respective stair of the interconnect structure 20, so as to couple the memory cells 30 in the corresponding level of the memory cell array 10.

In the three-dimensional memory 100, assuming the memory cell array 10 includes the levels LV0, LV1 and LV2 stacked along Z direction and the Z direction is perpendicular to the X and Y directions. In some embodiments, the level LV1 is formed over the level LV2, and the level LV0 is formed over the level LV1. In some embodiments, the sub-bit lines BL0_0, BL1_0 and BL2_0 are arranged in a first stair 21 of the interconnect structure 20, so as to couple the memory cells 30 in the level LV0 of the memory cell array 10 through the interconnect structure 20. Furthermore, the sub-bit lines BL0_1, BL1_1 and BL2_1 are arranged in a second stair 22 of the interconnect structure 20, so as to couple the memory cells 30 in the level LV1 of the memory cell array 10 through the interconnect structure 20. Moreover, the sub-bit lines BL0_2, BL1_2 and BL2_2 are arranged in a third stair 23 of the interconnect structure 20, so as to couple the memory cells 30 in the level LV2 of the memory cell array 10 through the interconnect structure 20.

In FIG. 1, the source line SL0 may include the sub-source lines SL0_0 through SL0_2, and each of sub-source lines SL0_0 through SL0_2 is arranged in the respective stair of the interconnect structure 20, so as to couple the memory cells 30 in the corresponding level of the memory cell array 10. Similarly, the source line SL1 may include the sub-source lines SL1_0 through SL1_2, and each of sub-source lines SL1_0 through SL0_2 is arranged in the respective stair of the interconnect structure 20, so as to couple the memory cells 30 in the corresponding level of the memory cell array 10.

In some embodiments, the sub-source lines SL0_0 and SL1_0 are arranged in the first stair 21 of the interconnect structure 20, so as to couple the memory cells 30 in the level LV0 of the memory cell array 10 through the interconnect structure 20. Furthermore, the sub-source lines SL0_1 and SL1_1 are arranged in the second stair 22 of the interconnect structure 20, so as to couple the memory cells 30 in the level LV1 of the memory cell array 10 through the interconnect structure 20. Moreover, the sub-source lines SL0_2 and SL1_2 are arranged in the third stair 23 of the interconnect structure 20, so as to couple the memory cells 30 in the level LV2 of the memory cell array 10 through the interconnect structure 20.

The memory cells 30 of the same level in the memory cell array 10 may share the sub-bit line or the sub-source line. Moreover, the memory cells 30 of the different levels in the memory cell array 10 may not share the sub-bit line and the sub-source line.

In some embodiments, the bit lines BL (e.g., sub-bit lines BL0_0-BL0_2, BL1_0-BL1_2 and BL2_0-BL2_2) are coupled to the other circuits through the higher metal layer, and the source lines SL (e.g., sub-source lines SL0_0-SL0_2 and SL1_0-SL1_2) are coupled to the other circuits through the higher metal layer.

The three-dimensional memory 100 further includes multiple word lines (not shown) coupled to the memory cell array 10 through the word line via WL_via. The word lines are coupled between the memory cell array 10 and a word line driver (or decoder) (not shown), and the word lines are configured to provide word line information to the memory cells 30 of the memory cell array 10. In some embodiments, the word lines are formed in the same layer under the memory cell array 10. In some embodiments, the word lines are formed in the same layer over the memory cell array 10. In some embodiments, the memory cells 30 of the different levels in the memory cell array 10 may share the same word line.

Figure 2:
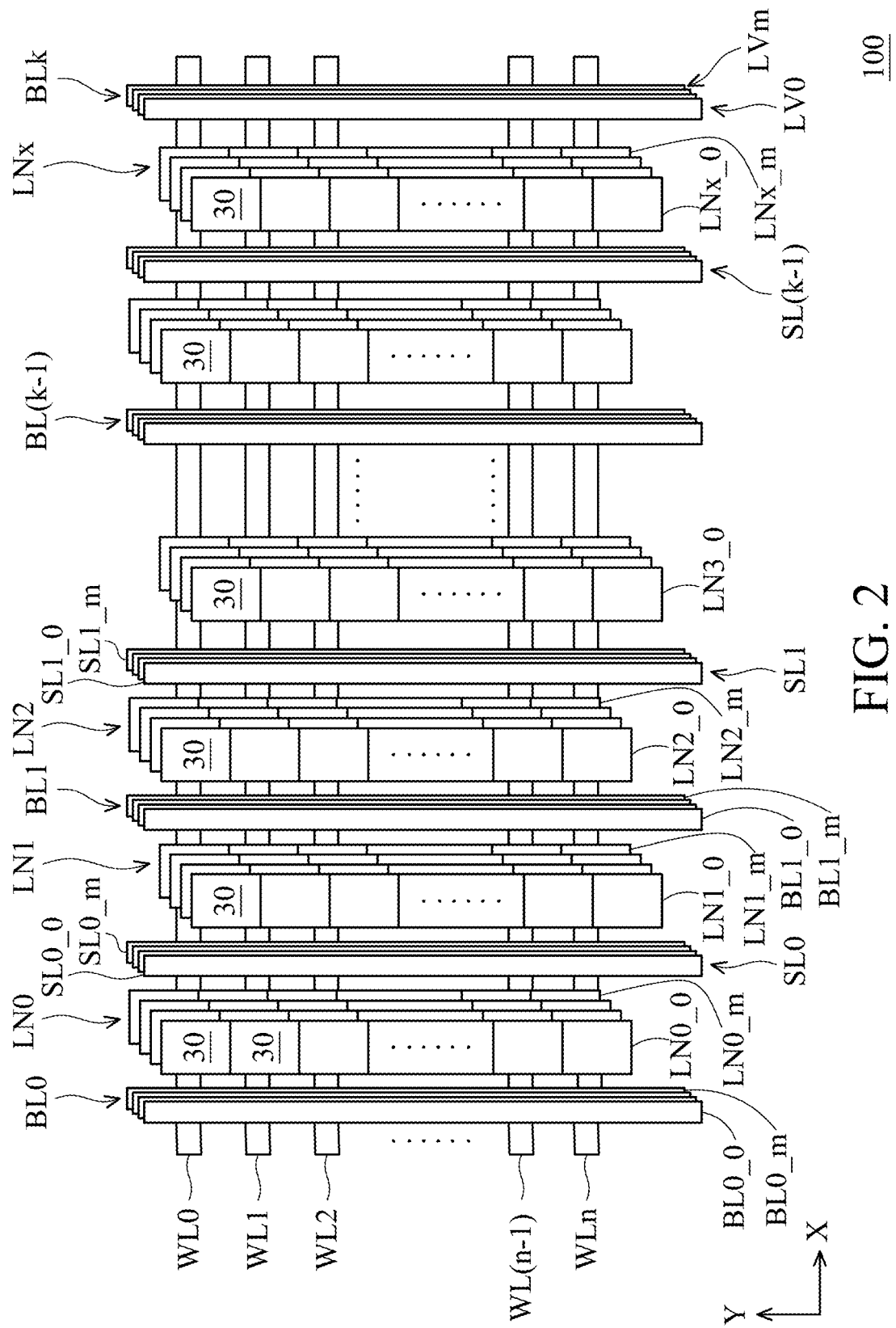
FIG. 2 shows a schematic block illustrating a three-dimensional memory, in accordance with some embodiments of the disclosure.

FIG. 2 shows a schematic block illustrating a three-dimensional memory 100, in accordance with some embodiments of the disclosure. The three-dimensional memory 100 includes multiple word lines WL0 to WLn, multiple bit lines BL0 to BLk, multiple source lines SL0 to SL(k−1) and multiple memory cells 30. The memory cells 30 are arranged in multiple lines LN0-LNx of a memory cell array (e.g., 10 of FIG. 1). Furthermore, the memory cell array includes multiple levels LV0 to LVm.

In the memory cell array, the memory cells 30 are divided into multiple groups, and each group of memory cells 30 is arranged in respectively level of the levels LV0 to LVm. Furthermore, the word lines WL0 to WLn extend in the X direction. Furthermore, the word lines WL0 to WLn are arranged under the memory cell array. In some embodiments, the word lines WL0 to WLn are arranged over the memory cell array.

Each of the bit lines BL0 to BLk include multiple sub-bit lines. For example, the bit line BL0 includes the sub-bit lines BL0_0 to BL0_$m$, and the bit line BL1 includes the sub-bit lines BL1_0 to BL1_$m$. For each of the bit lines BL0 to BLk, the number of sub-bit lines is equal to the number of levels LV0 to LVm. Each sub-bit line corresponds one of the groups of memory cells 30. Moreover, Each sub-bit line is arranged in respectively one level of the levels LV0 to LVm. For example, the sub-bit line BL0_0 is arranged in the level LV0, and the sub-bit line BL0_$m$ is arranged in the level LVm.

In some embodiments, the bit lines BL0 to BLk extend in the Y direction. Furthermore, for each of the bit lines BL0 to BLk, the sub-bit lines are stacked along a line that is perpendicular to the plane formed by the X direction and the Y direction (e.g., the Z direction of FIG. 1). For example, the sub-bit line BL0_0 is the highest line and the sub-bit line BL0_$m$ is the lowest line in the stacked sub-bit lines of bit-line BL0.

Each of the source lines SL0 to SL(k−1) include multiple sub-bit lines. For example, the source line SL0 includes the sub-bit lines SL0_0 to SL0_$m$, and the source line SL1 includes the sub-source lines SL1_0 to SL1_$m$. For each of the source lines SL0 to SL(k−1), the number of sub-source lines is equal to the number of levels LV0 to LVm. Each sub-source line corresponds one of the groups of memory cells 30. Moreover, Each sub-source line is arranged in respectively one level of the levels LV0 to LVm. For example, the sub-source line SL0_0 is arranged in the level LV0, and the sub-source line SL0_$m$ is arranged in the level LVm.

In some embodiments, the source lines SL0 to SL(k−1) extend in the Y direction. Furthermore, for each of the source lines SL0 to SL(k−1), the sub-bit lines are stacked along a line perpendicular to the plane formed by X direction and Y direction (e.g., Z direction of FIG. 1). For example, the sub-source line SL0_0 is the highest line and the sub-source line SL0_$m$ is the lowest line in the stacked source-bit lines of source-line SL0.

The source lines SL0 to SL(k−1) are parallel to the bit lines BL0 to BLm. In each of the levels LV1 to LVm, the sub-source lines and the sub-bit lines are interlaced. For example, the sub-source line SL0_0 is disposed between the sub-bit lines BL0_0 and BL1_0, i.e., the sub-source line SL0_0 is surrounded by the sub-bit lines BL0_0 and BL1_0. Similarly, the sub-bit line BL1_0 is disposed between the sub-source lines SL0_0 and SL1_0, i.e., the sub-bit line BL1_0 is surrounded by the sub-source lines SL0_0 and SL1_0.

In the memory cell array of FIG. 2, the memory cells 30 are divided into multiple lines LN0 to LNx. Each of the lines LN0 to LNx includes multiple sub-lines in the levels LV0 to LVm. For example, for the line LN0, the sub-line LN0_0 is arranged in the level LV0, and the sub-line LN0_$m$ is arranged in the level LVm. Similarly, for the line LN1, the sub-line LN1_0 is arranged in the level LV0, and the sub-line LN1_$m$ is arranged in the level LVm. For each of the lines LN0 to LNx, the number of sub-lines is equal to the number of levels LV0 to LVm.

In each of the levels LV0 to LVm of the memory cell array, the group of the memory cells 30 are arranged in the corresponding sub-lines of the lines LN0 to LNx. For example, in the level LV0, the memory cells 30 are arranged in the sub-lines LN0_0, LN1_0, . . . , LNx_0. Furthermore, the number of memory cells 30 in the sub-lines of each level are the same.

In each of the levels LV0 to LVm, the sub-lines of the lines LN0 to LNx are separated by the sub-bit line or the sub-source line. For example, in the level LV0, the sub-lines LN0_0 and LN1_0 are separated by the sub-source line SL0_0, and the sub-lines LN1_0 and LN2_0 are separated by the sub-bit line BL1_0. Furthermore, in each of the levels LV0 to LVm, the sub-source line is surrounded by the two adjacent sub-lines. Similarly, the sub-bit line is surrounded by the two adjacent sub-lines.

In each of the levels LV0 to LVm, the sub-source line is shared by the memory cells of two adjacent sub-lines, and the sub-bit line is shared by the memory cells of two adjacent sub-lines. For example, in the level LV0, the sub-source line SL0_0 is shared by the memory cells in the sub-lines LN0_0 and LN1_0, and the sub-bit line BL1_0 is shared by the memory cells in the sub-lines LN1_0 and LN2_0.

In the memory cell array of FIG. 2, the lines LN0 to LNx of the memory cells 30 extend in the Y direction. Furthermore, for each of the lines LN0 to LNx, the sub-lines are stacked along a line perpendicular to the plane formed by X direction and Y direction (e.g., Z direction of FIG. 1). For example, the sub-line LN0_0 is the highest line and the sub-line LN0_$m$ is the lowest line in the stacked sub-lines of line LN0.

In each of the levels LV0 to LVm, the memory cells of odd sub-lines are aligned with each other, and the memory cells of even sub-lines are aligned with each other. In other words, the memory cells of odd sub-lines are not aligned with the memory cells of even sub-lines, i.e., the two adjacent sub-lines will not be aligned. For example, in the level LV0, the sub-line LN0_0 is the first sub-line and the sub-line LN2_0 is the third sub-line, and the sub-line LN0_0 is aligned with the sub-line LN2_0. Moreover, the sub-line LN1_0 is the second sub-line and the sub-line LN3_0 is the fourth sub-line, and the sub-line LN1_0 is aligned with the sub-line LN3_0. However, the sub-line LN1_0 is not aligned with the sub-lines LN0_0 and LN2_0.

Figure 3:
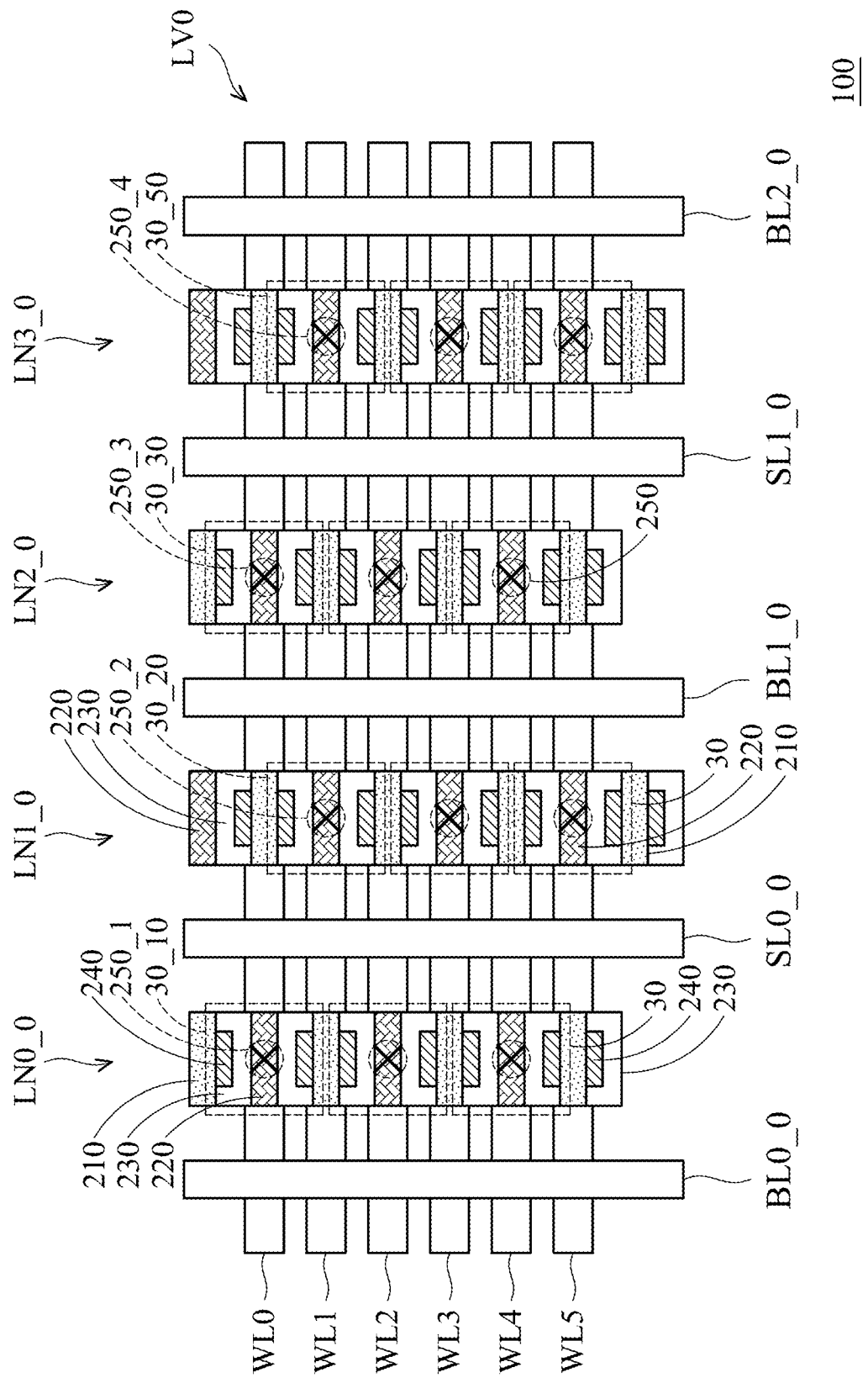
FIG. 3 shows a top view of the three-dimensional memory of FIG. 2, in accordance with some embodiments of the disclosure.

FIG. 3 shows a top view of the three-dimensional memory 100 of FIG. 2, in accordance with some embodiments of the disclosure. In order to simplify the description, only some word lines under the memory cell array and some memory cells 30 in the level LV0 of the memory cell array are shown in FIG. 3.

In the sub-lines LN0_0, LN1_0, LN2_0 and LN3_0, the memory cells 30 are shown in perspective. In some embodiments, each memory cell 30 includes at least one transistor, and the transistor is a GAA transistor. The channel 220 of each memory cell 30 is a nanowire or nanosheet.

In each of the sub-lines LN0_0, LN1_0, LN2_0 and LN3_0, the memory cells 30 are separated from each by a dielectric layer 210. The channel 220 of the transistor in each memory cell 30 is wrapped by a memory film 230. A type of the three-dimensional memory 100 is determined according to the material of the memory film 230. The material of the memory film 230 includes oxide-nitride-oxide (ONO), nitride-oxide-nitride (NON), SiN, ferroelectric (FE) and so on. If the material of the memory film 230 includes ONO, the 3D memory 100 may be a NOR flash. If the material of the memory film 230 includes FE material, the 3D memory 100 may be a ferroelectric RAM.

In each memory cell 30, the memory film 230 is wrapped by a gate electrode (or metal gate) 240. For the memory cell 30, the gate electrode 240 is functioned as the gate of the transistor in the memory cell 30, and the gate of the transistor is coupled to the corresponding word line through the via 250 (e.g., the word line via WL_via of FIG. 1). For example, the memory cell 30_10 of the sub-line LN0_0 is coupled to the word line WL0 through the via 250_1. The memory cell 30_20 of the sub-line LN1_0 is coupled to the word line WL1 through the via 250_2, and the memory cell 30_30 of the sub-line LN2_0 is coupled to the word line WL0 through the via 250_3. Furthermore, the memory cell 30_50 of the sub-line LN3_0 is coupled to the word line WL1 through the via 250_4.

In FIG. 3, the channels 220 of the memory cells 30_10 and 30_30 are formed over the word line WL0, and the channels 220 of the memory cells 30_20 and 30_50 are formed over the word line WL1. Therefore, the memory cells 30_10 and 30_30 are aligned with each other, and the memory cells 30_20 and 30_50 are aligned with each other. However, the memory cells 30_10 and 30_30 are not aligned with the memory cells 30_20 and 30_50. i.e., the positions of the memory cells 30_10 and 30_30 and the positions of the memory cells 30_20 and 30_50 are staggered.

In some embodiments, the channel 220 of the memory cell 30_20 in the sub-line LN1_0 is aligned with the dielectric layer 210 in the boundary of the memory cell 30_10 in sub-line LN0_0 and the dielectric layer 210 in the boundary of the memory cell 30_30 in sub-line LN2_0. Furthermore, the channel 220 of the memory cell 30_10 in the sub-line LN0_0 is aligned with the dielectric layer 210 in the boundary of the memory cell 30_20 in the sub-line LN1_0 and the channel of the memory cell 30_30 in the sub-line LN2_0.

Figure 4:
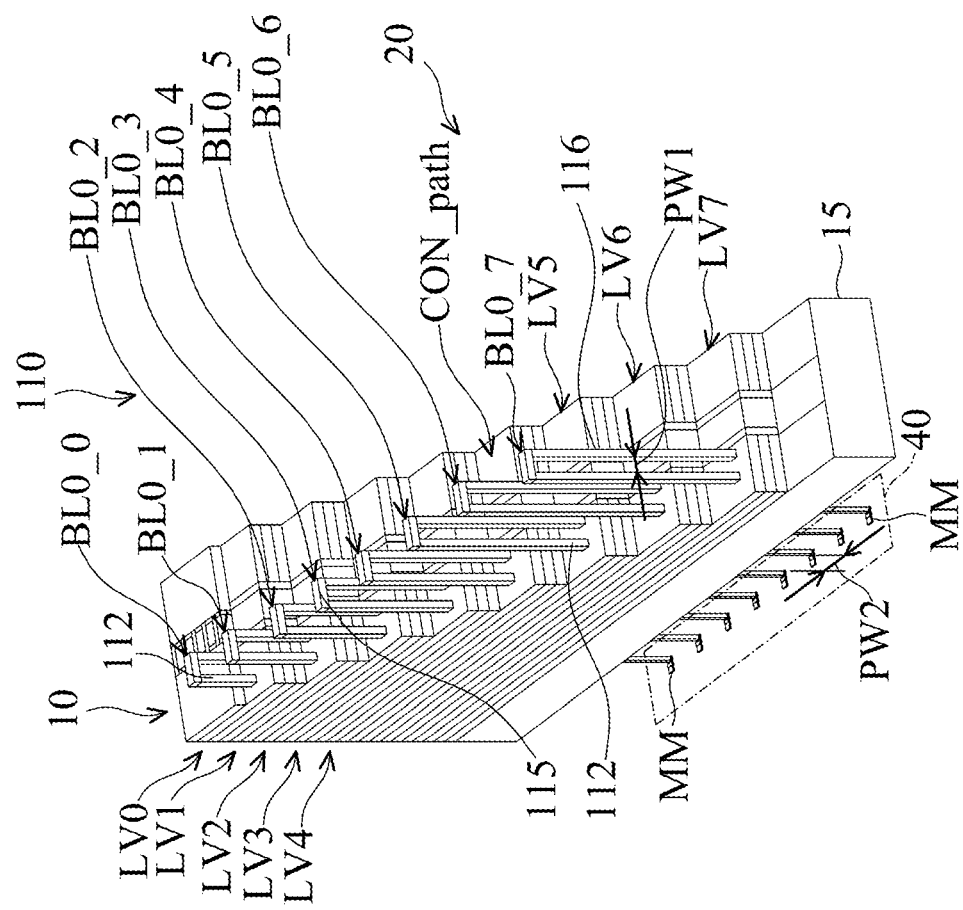
FIG. 4 shows a stereoscopic view of a three-dimensional memory 100A, in accordance with some embodiments of the disclosure.

FIG. 4 shows a stereoscopic view of a three-dimensional memory 100A, in accordance with some embodiments of the disclosure. The three-dimensional memory 100A includes the memory cell array 10, the interconnect structure 20, the interconnect (or hookup) structure 110, and a bit line decoder 40. The memory cell array 10, the interconnect structure 20 are formed over a semiconductor substrate 15. In some embodiments, the semiconductor substrate 15 is a Si substrate. In some embodiments, the material of the semiconductor substrate 15 is selected from a group consisting of bulk-Si, SiP, SiGe, SiC, SiPC, Ge, SOI-Si, SOI-SiGe, SiN, III-VI material, and combinations thereof.

In the three-dimensional memory 100A, the memory cell array 10 includes multiple levels (e.g., LV0-LV7), and each level includes multiple memory cells 30. In order to simplify the description, only some memory cells 30 arranged in a line of the memory cell array 10 are shown in FIG. 4.

As described above, the interconnect structure 20 is configured to provide the bit lines BL and/or the source lines SL to the memory cell array 10. In order to simplify the description, only the sub-bit lines BL0_0 through BL0_7 of the bit line BL0 are shown in the interconnect structure 20. In such embodiment, the sub-bit lines BL0_0 through BL0_7 extend in the Y direction to connect the corresponding levels LV0-LV7 of the memory cell array 10. For example, the sub-bit line BL0_0 is configured to couple the memory cells 30 in the level LV0 of the memory cell array 10, the sub-bit line BL0_1 is configured to couple the memory cells 30 in the level LV1 of the memory cell array 10, the sub-bit line BL0_2 is configured to couple the memory cells 30 in the level LV2 of the memory cell array 10, and so on.

In FIG. 4, the interconnect structure 20 and the memory cell array 10 are formed over the semiconductor substrate 15, and the bit line decoder 40 is formed under the semiconductor substrate 15. In other words, the bit line decoder 40 is a CMOS under array (CuA). Moreover, the bit line decoder 40 includes multiples transistors MM coupled to the corresponding sub-bit lines. In some embodiments, the transistors MM are planar transistors or fin transistors. Because the bit line decoder 40 is formed under the semiconductor substrate 15, an integrated circuit (IC) having the three-dimensional memory 100 is decreased, i.e., the chip area of the IC is decreased.

The interconnect structure 110 is configured to connect the sub-bit lines BL0_0 through BL0_7 of the bit line BL0 from the interconnect structure 20 to the bit line decoder 40 passing through the interconnect structure 20 and the semiconductor substrate 15. Specifically, each of the sub-bit lines BL0_0 through BL0_7 in the interconnect structure 20 is coupled to the corresponding transistor MM of the bit line decoder 40 through respective conductive paths CON_path (or hookup structure) in the interconnect structure 110.

In the interconnect structure 110, each conductive path CON_path is formed by the conductive features 112, 115 and 116, and the conductive features 112 are coupled to the conductive features 116 through the conductive features 115. The distances of the conductive paths CON_path are different in the interconnect structure 110.

In some embodiments, the conductive feature 112 may be a first via extending in the Z1 direction and in contact with the corresponding sub-bit line. Furthermore, the conductive features 112 in the interconnect structure 110 have the different lengths. For example, in the conductive path CON_path corresponding to the sub-bit line BL0_7, the conductive feature 112 is in contact with the sub-bit line BL0_7 in the level LV7 of the interconnect structure 20, and the conductive feature 112 is a longest conductive feature since the level LV7 is the lowest level in the interconnect structure 20. Furthermore, in the conductive path CON_path corresponding to the sub-bit line BL0_0, the conductive feature 112 is in contact with the sub-bit line BL0_0 in the level LV0 of the interconnect structure 20, and the conductive feature 112 is a shorter conductive feature since the level LV0 is the higher level in the interconnect structure 20.

In some embodiments, the conductive feature 115 may be a metal line extending in the X direction, and the metal line is formed in a layer over the interconnection structure 110. In such embodiments, the conductive features 115 of the various conductive paths CON_path are formed in the same metal layer. Furthermore, the conductive features 115 are the same length.

In some embodiments, the conductive feature 116 may be a second via extending in the Z2 direction and pass through the interconnect structure 20 and the semiconductor substrate 15, so as to connect the transistor MM of the bit line decoder 40. The Z2 direction is antiparallel to the Z1 direction. Furthermore, the conductive features 116 in the conductive paths CON_path are the same length between the conductive features 115 and the bit line decoder 40. In the layout of the interconnect structure 110, the conductive features 116 are arranged in a first line and the conductive features 112 are arranged in a second line parallel to and adjacent the first line.

The conductive feature 116 is separated from the interconnect structure 20 by an isolation material. Therefore, compared with the conductive feature 112 that is in contact with the sub-bit line of the interconnect structure 20, the conductive feature 116 is not in contact with the interconnect structure 20. For each sub-bit line in the levels of the interconnect structure 20, the conductive feature 112 is coupled to the conductive feature 116 through the corresponding conductive feature 115.

In the interconnect structure 20, the area of the sub-bit line in each level that is not overlapped by the upper layer is large enough to accommodate the conductive features 112 and 116. Thus, the pitch width PW1 between the conductive features 112 and 116 is enough to meet IC processing requirements, i.e., it does not affect the critical dimension (CD) of the IC. Furthermore, the pitch width PW2 between the two adjacent conductive features 116 is enough to meet IC processing requirements. In some embodiments, the pitch width PW2 is greater than the pitch width PW1.

The pitch widths PW1 and PW2 are not be limited by size of the exposed area of the sub-bit/sub-source line in each level that are not overlapped by the upper layer, and the three-dimensional memory (e.g., 100A) may be a high-density memory with numerous bit lines and source lines or with numerous sub-bit lines and sub-source lines. The high-density memory is the three-dimensional memory having high bandwidth, lower cost and higher capacity.

By using the interconnect structure 110 to connect the memory cell array 10 and the bit line decoder 40, the metal routing complexity is decreased for the conductive features 112, 115 and 116 of the conductive paths CON_path, thereby decreasing RC value for the conductive paths CON_path in the interconnect structure 110.

In some embodiments, a source line decoder (not shown) is formed under the semiconductor substrate 15, and an interconnect structure (not shown) is configured to connect the sub-source lines of the interconnect structure 20 to the source line decoder passing through the interconnect structure 20. The interconnected structure coupled to the source line decoder has a configuration similar to the interconnect structure 110.

FIGS. 5A-5E illustrate a process flow for fabricating the three-dimensional memory 100A of FIG. 4, in accordance with some embodiments of the disclosure. The structure in FIGS. 5A-5E is merely an example and is not intended to limit the present disclosure beyond what is explicitly recited in the claims. Formation of the structure in FIGS. 5A-5E may include a variety of GAA processes such as deposition, epitaxy, photolithography, or etching.

Figure 5B:
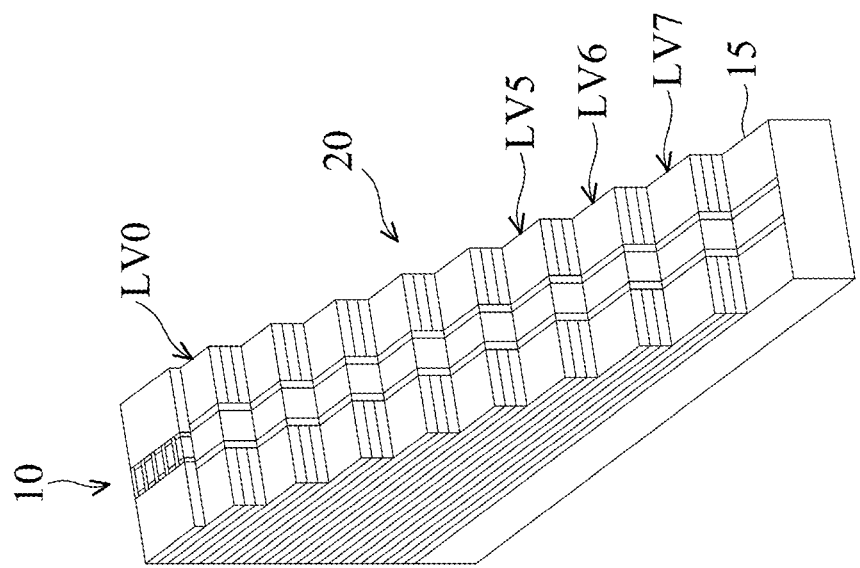
FIGS. 5A-5E illustrate a process flow for fabricating the three-dimensional memory of FIG. 4, in accordance with some embodiments of the disclosure.
Figure 5A:
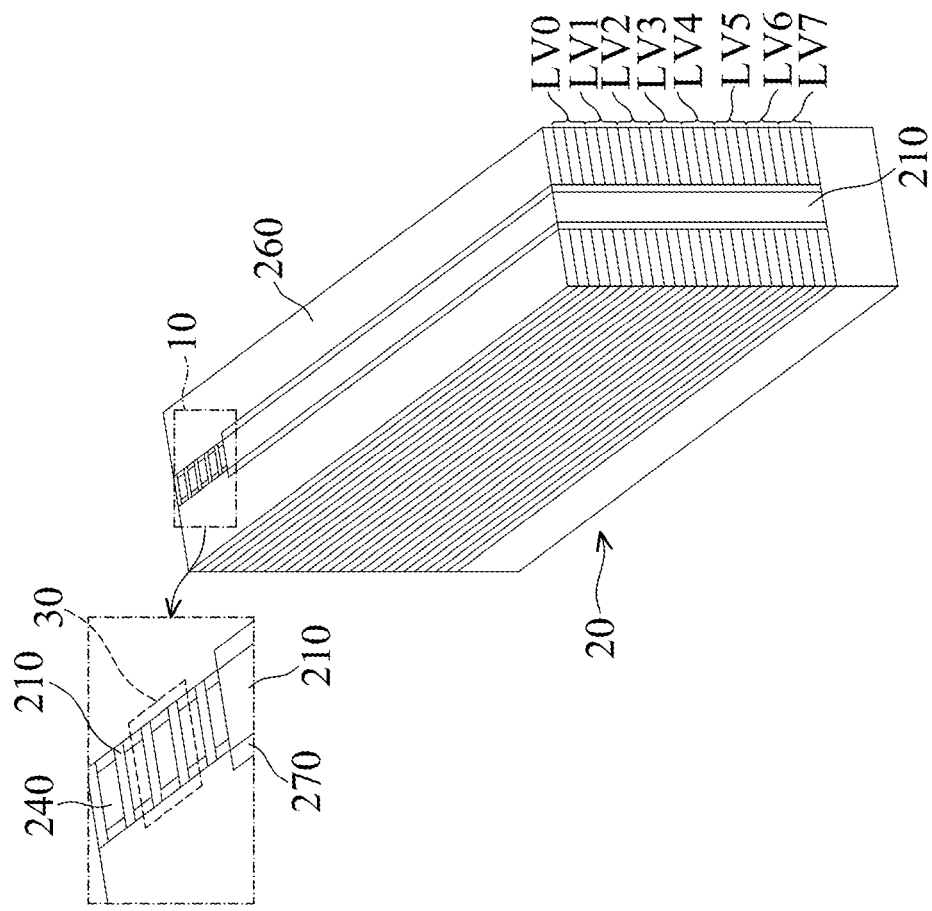

In FIG. 5A, a stack of multiple levels are formed over a semiconductor structure 15 to formed a memory cell array 10. Each layer of the memory cell array 10 includes a plurality of memory cells 30. In the same layer, the memory cells 30 arranged in the same line are separated by the dielectric layer 210. Furthermore, the gate electrodes 240 are separated from each other by the dielectric layer 210. Moreover, the gate electrodes 240 are separated from the isolation layer 260 by the memory film 230. The material of the memory film 230 may include oxide-nitride-oxide (ONO), nitride-oxide-nitride (NON), SiN, ferroelectric (FE) and so on. Furthermore, a type of the memory cell array 100A is determined according to the material of the memory film 230.

In FIG. 5A, an interconnection structure 20 is formed over the semiconductor structure 15, and the interconnection structure 20 is on one side of the memory cell array 10. Similarly, the interconnection structure 20 includes multiple layers similar to the levels LV0-LV7 of the memory cell array 10, and the number of layers in the interconnection structure 20 is equal to the number of layers LV0-LV7 in the memory cell array 10. In order to simplify the description, the levels of the interconnection structure 20 connected to the levels LV0-LV7 of the memory cell array 10 have the same naming. For example, the level of the interconnection structure 20 connected to the level LV0 of the memory cell array 10 is also named as LV0, and the level of the interconnection structure 20 connected to the level LV7 of the memory cell array 10 is also named as LV7. Furthermore, for the memory cells 30 arranged in the same line in the same layer of the memory cell array 10, the corresponding sub-bit line and the corresponding sub-source line are provided by the corresponding layer in the interconnection structure 20.

In each layer of the interconnection structure 20, the sub-bit line and the sub-source line are formed by the metal line, and the sub-bit line and the sub-source line are separated from each other by the dielectric layer 210. In some embodiments, the sub-bit line and the sub-source line are separated from the dielectric layer 210 by the isolation material 270.

In FIG. 5B, the stack of levels of the interconnection structure 20 are etched through the masking elements to form the interconnection structure 20 having a staircase shape. As described above, each sub-source/sub-bit line is arranged in the respective stair of the interconnect structure 20, so as to couple the memory cells 30 in the corresponding level of the memory cell array 10.

In the staircase interconnection structure 20 of FIG. 5B, the exposed areas of the sub-bit/sub-source line in each level that are not overlapped by the upper layer have the same area. For example, the exposed areas of the sub-bit/sub-source line in the level LV7 that are not overlapped by the level LV6 are equal to the exposed areas of the sub-bit/sub-source line in level LV6 that are not overlapped by level LV5. Furthermore, the exposed areas of the sub-bit/sub-source line in the level LV5 that are not overlapped by the level LV4 are equal to the exposed areas of the sub-bit/sub-source line in level LV4 that are not overlapped by level LV3.

Figure 5C:
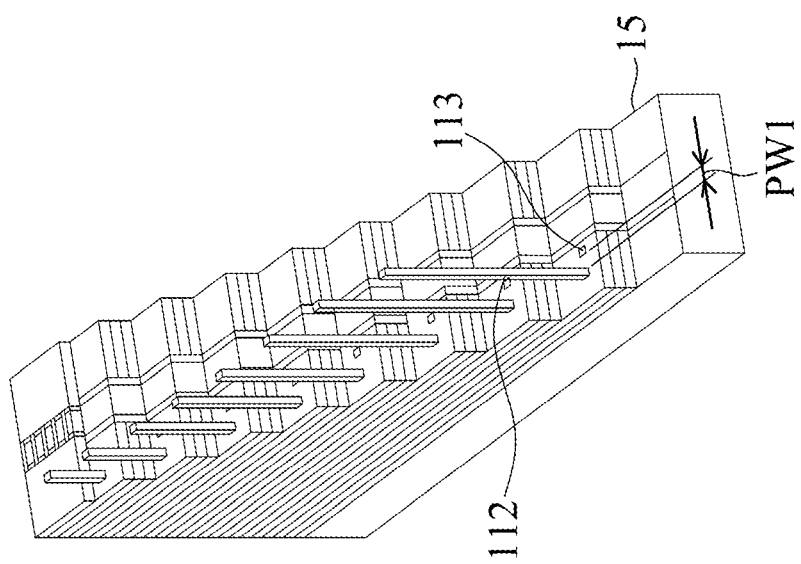

In FIG. 5C, the conductive features 112 are formed in the stairs of the interconnection structure 20. Each conductive feature 112 is formed on the corresponding stair and in contact with the corresponding sib-bit/sub-source line. In order to simplify the description, only the sub-bit lines of one bit line are shown in the interconnect structure 20. Furthermore, in each stair of the interconnection structure 20, a hole 113 is formed from the stair to the semiconductor structure 15 passing through the interconnection structure 20 and the semiconductor structure 15. A distance between the hole 113 and the conductive features 112 is equal to PW1. After the holes 113 are formed in the interconnection structure 20, an isolation material is formed a film in the holes 113.

The conductive features 112 have different lengths. For example, the conductive feature 112 that is in contact with the sub-bit line of the level LV7 of the interconnect structure 20 is the longer conductive feature 112. Moreover, the conductive feature 112 that is in contact with the sub-bit line of the level LV0 of the interconnect structure 20 is the shorter conductive feature 112.

Figure 5E:
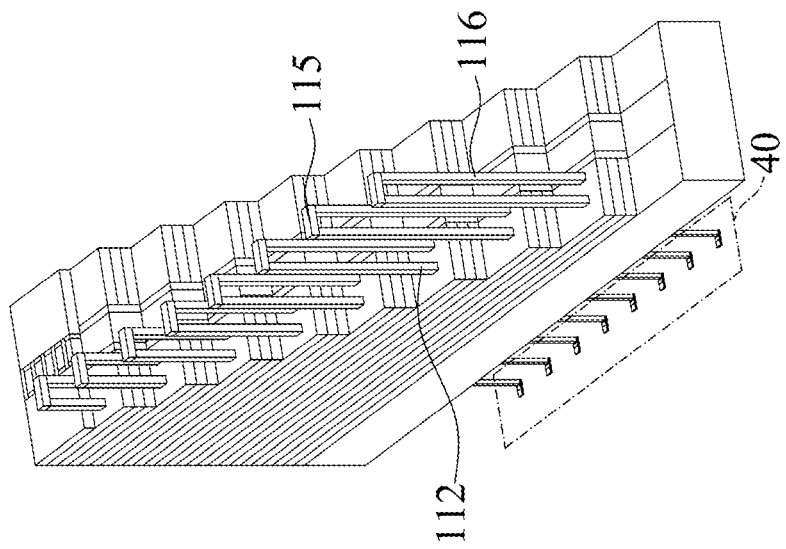
Figure 5D:
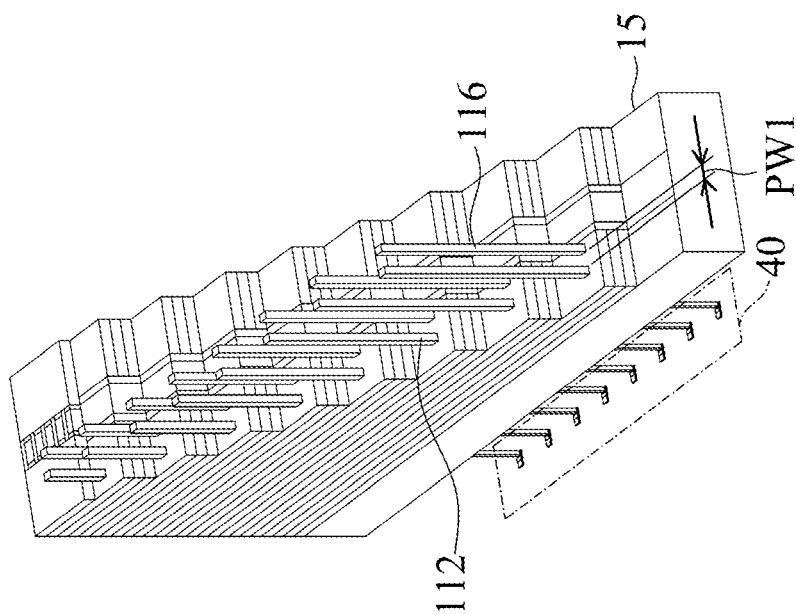

In FIG. 5D, the conductive features 116 are formed to pass through the interconnect structure 20 and the semiconductor substrate 15 through the holes 113, so as to connect the bit-line decoder 40. In some embodiments, the bit-line decoder 40 is formed below the semiconductor substrate 15 after the interconnect structure 20 is formed. In some embodiments, the portion of the conductive features 116 in and over the holes 113 are formed first, and then the remaining portion of the conductive features 116 below the semiconductor substrate 15 are formed. In each level of the interconnect structure 20, the adjacent conductive features 112 and 116 have a pitch width PW1. The conductive features 116 are all the same length.

In FIG. 5E, the conductive features 115 are formed in a metal layer over the interconnect structure 20, so as to connect the conductive features 112 to the conductive features 116. Thus, the sub-bit lines of the interconnect structure 20 are coupled to the bit-line decoder 40 through the conductive features 112, the conductive features 115 and the conductive features 116 in sequence.

In some embodiments, a source line decoder (not shown) is formed under the semiconductor substrate 15, and the sub-source lines in each level of the interconnect structure 20 are coupled to the source line decoder through an interconnect structure that may have a configuration similar to the interconnect structure 20.

Figure 6:
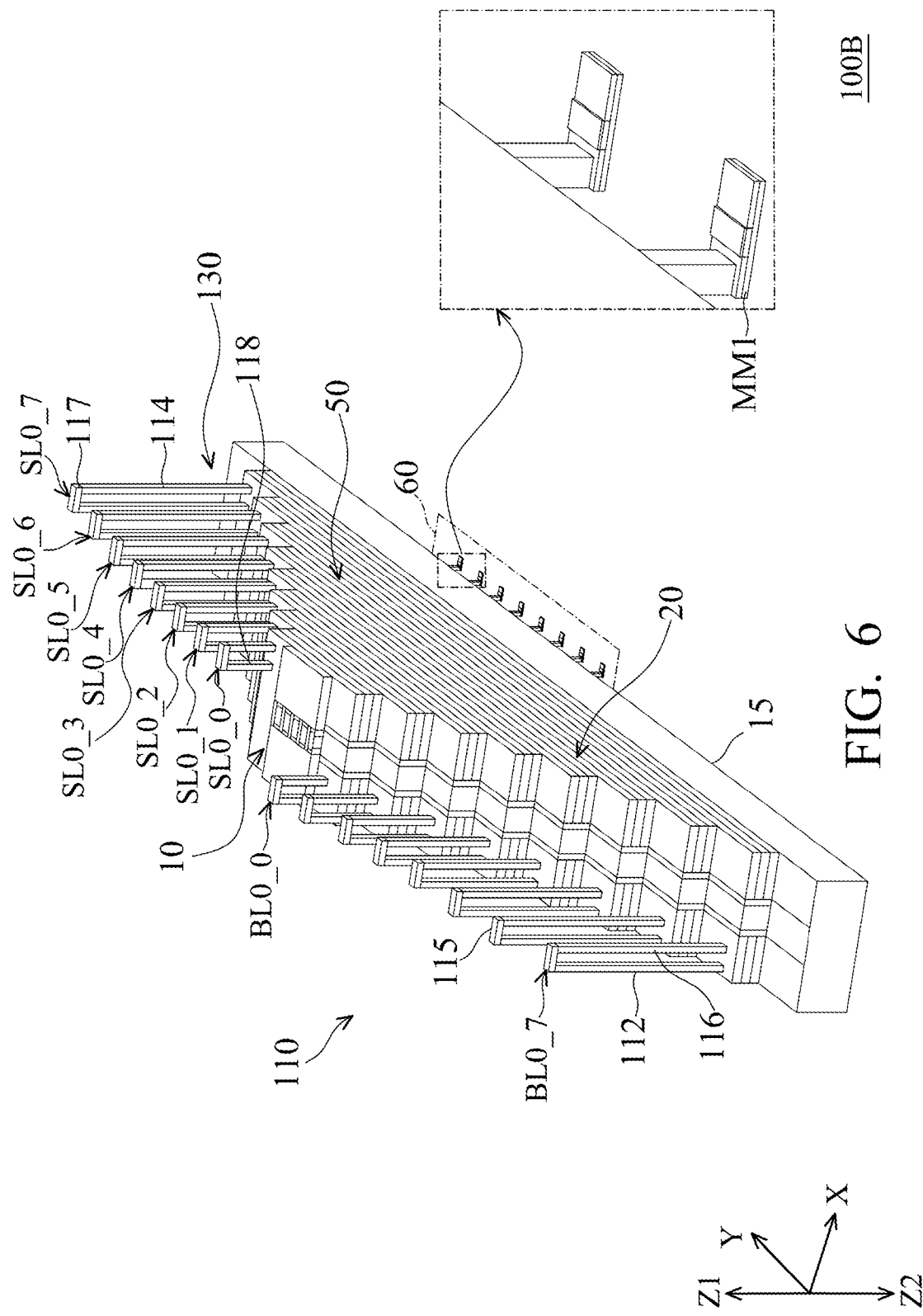
FIG. 6 shows a stereoscopic view of a three-dimensional memory, in accordance with some embodiments of the disclosure.

FIG. 6 shows a stereoscopic view of a three-dimensional memory 100B, in accordance with some embodiments of the disclosure. Compared with the three-dimensional memory 100A of FIG. 4, the three-dimensional memory 100B further includes the interconnect structure 50, the interconnect structure 130, and the source line decoder 60. The interconnect structure 50 is formed over the semiconductor substrate 15, and the source line decoder 60 is formed under the semiconductor substrate 15.

In the three-dimensional memory 100B, the interconnect structure 20 is configured to provide the bit lines BL to the memory cell array 10, and the interconnect structure 50 is configured to provide the source lines SL to the memory cell array 10. In order to simplify the description, only the sub-bit lines BL0_0 through BL0_7 of the bit line BL0 are shown in the interconnect structure 20, and only the sub-source lines SL0_0 through SL0_7 of the bit line SL0 are shown in the interconnect structure 50. In such embodiment, the sub-bit lines BL0_0 through BL0_7 and the sub-source lines SL0_0 through SL0_7 extend in the Y direction to connect the corresponding levels LV0-LV7 of the memory cell array 10.

In FIG. 6, the interconnect structures 20 and 50 and the memory cell array 10 are formed over the semiconductor substrate 15, and the interconnect structures 20 and 50 are formed on opposite sides of the memory cell array 10. Moreover, the bit line decoder (e.g., 40 of FIG. 4) and the source line decoder 60 are formed under the semiconductor substrate 15. In other words, the bit line decoder and the source line decoder 60 are CMOS under array (CuA). Moreover, the source line decoder 60 includes multiples transistors MM1 coupled to the corresponding sub-source lines. In some embodiments, the transistors MM1 are planar transistors or fin transistors.

As described above, the interconnect structure 110 is configured to connect the sub-bit lines BL0_0 through BL0_7 of the bit line BL0 from the interconnect structure 20 to the bit line decoder 40 passing through the interconnect structure 20 and the semiconductor substrate 15.

The interconnect structure 130 is configured to connect the sub-source lines SL0_0 through SL0_7 of the bit line SL0 from the interconnect structure 50 to the source line decoder 60 passing through the interconnect structure 50 and the semiconductor substrate 15. Specifically, each of the sub-source lines SL0_0 through SL0_7 in the interconnect structure 50 is coupled to the corresponding transistor MM1 of the source line decoder 60 through respective conductive paths (or hookup structure) in the interconnect structure 130.

In the interconnect structure 130, each conductive path is formed by the conductive features 114, 117 and 118, and the conductive features 114 are coupled to the conductive features 118 through the conductive features 117. The distances of the conductive paths are different in the interconnect structure 130.

In some embodiments, the conductive feature 114 may be a third via extending in the Z1 direction and in contact with the corresponding sub-source line. Furthermore, the conductive features 114 have the different lengths. For example, the conductive feature 114 that is in contact with the sub-source line SL0_7 in the level LV7 of the interconnect structure 50, is a longer conductive feature since the level LV7 is the lower level in the interconnect structure 50. Furthermore, the conductive feature 114 that is in contact with the sub-source line SL0_0 in the level LV0 of the interconnect structure 50 is a shorter conductive feature since the level LV0 is the higher level in the interconnect structure 50.

In some embodiments, the conductive feature 117 may be a metal line extending in the X direction that is formed in a layer over the interconnection structure 130. In such embodiments, the conductive features 117 are formed in the same metal layer. Furthermore, the conductive features 117 are all the same length. In some embodiments, the conductive features 115 and 117 are formed in the same metal layer.

In some embodiments, the conductive feature 118 may be a fourth via extending in the Z2 direction and pass through the interconnect structure 50 and the semiconductor substrate 15, so as to connect the transistor MM1 of the source line decoder 60. The Z2 direction is antiparallel to the Z1 direction. Furthermore, the conductive features 118 are the same length between the conductive features 117 and the source line decoder 60.

The conductive feature 118 is separated from the interconnect structure 50 by an isolation material. Therefore, compared with the conductive feature 114 that is in contact with the sub-source line of the interconnect structure 50, the conductive feature 118 is not in contact with the interconnect structure 50. For each sub-source line in the levels of the interconnect structure 50, the conductive feature 114 is coupled to the conductive feature 118 through the corresponding conductive feature 117. In the interconnect structure 50, the area of the sub-source line in each level that is not overlapped by the upper layer is large enough to accommodate the conductive features 114 and 118. Thus, the pitch width PW1 between the conductive features 114 and 118 is enough to meet IC processing requirements, i.e., it does not affect the critical dimension (CD) of the IC. Furthermore, the pitch width PW2 between the two adjacent conductive features 118 is enough to meet IC processing requirements. In some embodiments, the pitch width PW2 is greater than the pitch width PW1.

In the three-dimensional memory 100B of FIG. 6, the source line decoder 60 and the bit line decoder (not shown) are arranged on opposite sides of the memory cell array 10, thus the layout (e.g., placement and routing) of the source line decoder 60 and the bit line decoder is arranged more flexibly.

Figure 7:
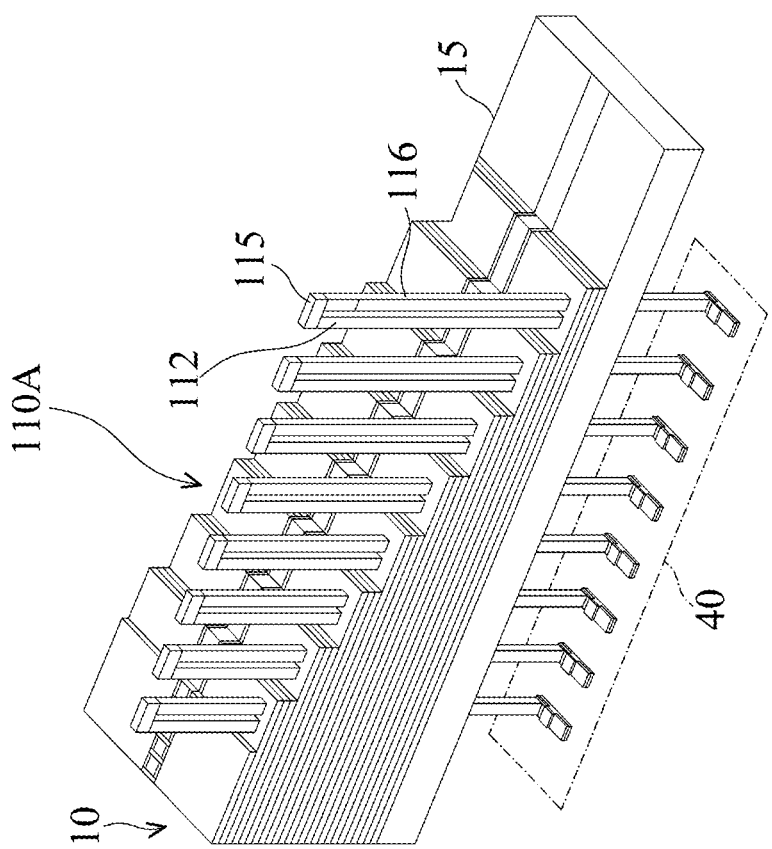
FIG. 7 shows a stereoscopic view of a three-dimensional memory, in accordance with some embodiments of the disclosure.

FIG. 7 shows a stereoscopic view of a three-dimensional memory 100C, in accordance with some embodiments of the disclosure. The three-dimensional memory 100C of FIG. 7 has a similar configuration to the three-dimensional memory 100A of FIG. 4. The difference between the interconnect structure 110A of FIG. 7 and the interconnect structure 110 of FIG. 4 is that the conductive features 112 and 116 are arranged in the same line in the layout, and the conductive features 112 and 116 are staggered in the same line. Furthermore, the conductive feature 115 in the interconnect structure 110A is a metal line extending in the Y direction, not the X direction. The conductive features 115 are formed in a layer over the interconnection structure 110A.

Figure 8:
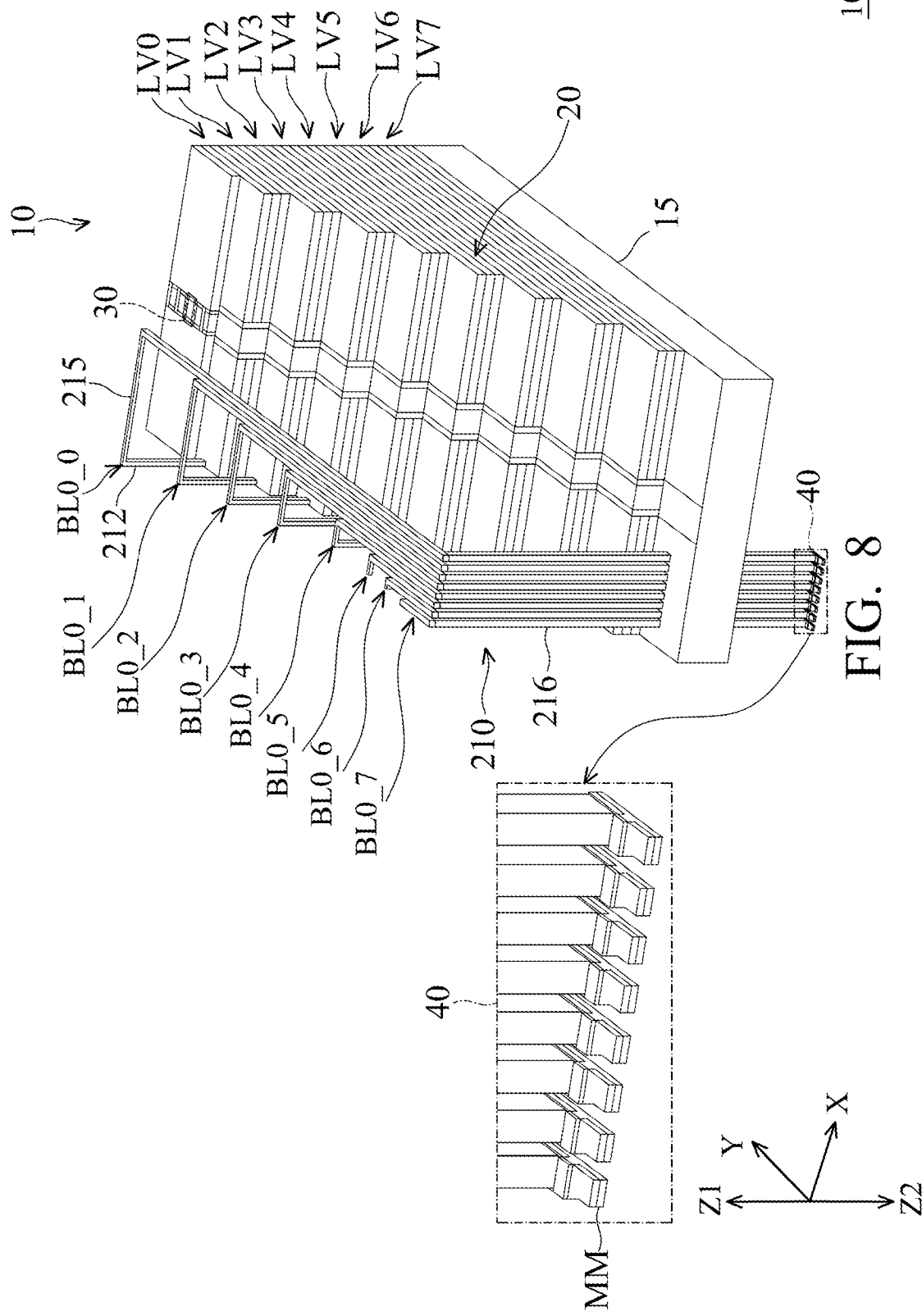
FIG. 8 shows a stereoscopic view of a three-dimensional memory, in accordance with some embodiments of the disclosure.

FIG. 8 shows a stereoscopic view of a three-dimensional memory 100D, in accordance with some embodiments of the disclosure. The three-dimensional memory 100D includes the memory cell array 10, the interconnect structure 20, the interconnect structure 210, and a bit line decoder 40. The memory cell array 10 and the interconnect structure 20 are formed over the semiconductor substrate 15.

In the three-dimensional memory 100D, the memory cell array 10 includes multiple levels (e.g., LV0-LV7), and each level includes multiple memory cells 30. In order to simplify the description, only some memory cells 30 arranged in a line of the memory cell array 10 are shown in FIG. 8.

As described above, the interconnect structure 20 is configured to provide the bit lines BL and/or the source lines SL to the memory cell array 10. In order to simplify the description, only the sub-bit lines BL0_0 through BL0_7 of the bit line BL0 are shown in the interconnect structure 20. In such embodiment, the sub-bit lines BL0_0 through BL0_7 extend in the Y direction to connect the corresponding levels LV0-LV7 of the memory cell array 10. For example, the sub-bit line BL0_0 is configured to couple the memory cells 30 in the level LV0 of the memory cell array 10, the sub-bit line BL0_1 is configured to couple the memory cells 30 in the level LV1 of the memory cell array 10, the sub-bit line BL0_2 is configured to couple the memory cells 30 in the level LV2 of the memory cell array 10, and so on.

In FIG. 8, the interconnect structure 20 and the memory cell array 10 are formed over the semiconductor substrate 15, and the bit line decoder 40 is formed under the semiconductor substrate 15. Moreover, the bit line decoder 40 includes multiples transistors MM coupled to the corresponding sub-bit lines. In some embodiments, the transistors MM are planar transistors or fin transistors.

The interconnect structure 210 is configured to connect the sub-bit lines BL0_0 through BL0_7 of the bit line BL0 from the interconnect structure 20 to the bit line decoder 40 passing through the semiconductor substrate 15 without through the interconnect structure 20. Specifically, each of the sub-bit lines BL0_0 through BL0_7 in the interconnect structure 20 is coupled to the corresponding transistor MM of the bit line decoder 40 through respective conductive paths (not shown) or hookup structure (not shown) in the interconnect structure 210.

In the interconnect structure 210, each conductive path is formed by the conductive features 212, 215 and 216, and the conductive features 212 are coupled to the conductive features 216 through the conductive features 215. The distances of the conductive paths may be the same or different in the interconnect structure 210.

In some embodiments, the conductive feature 212 may be a fifth via extending in the Z1 direction and in contact with the corresponding sub-bit line. Furthermore, the conductive features 212 in the conductive paths have the different lengths. For example, in the conductive path corresponding to the sub-bit line BL0_7, the conductive feature 212 is in contact with the sub-bit line BL0_7 in the level LV7 of the interconnect structure 20, and the conductive feature 212 is a longer conductive feature since the level LV7 is the lower level in the interconnect structure 20. Furthermore, in the conductive paths corresponding to the sub-bit line BL0_0, the conductive feature 212 is in contact with the sub-bit line BL0_0 in the level LV0 of the interconnect structure 20, and the conductive feature 212 is a shorter conductive feature since the level LV0 is the higher level in the interconnect structure 20.

In some embodiments, the conductive feature 215 may be a metal line with one or two segments formed in a layer over the interconnection structure 210. In some embodiments, one segment of the metal line extends along the X direction and another segment of the metal line extends along the Y direction. In such embodiments, the conductive features 215 are formed in the same metal layer. Furthermore, the conductive features 215 have the different lengths. For example, the conductive feature 215 corresponding to the sub-bit line BL0_0 is the longer conductive feature 215, and the conductive feature 215 corresponding to the sub-bit line BL0_7 is the shorter conductive feature 215.

In some embodiments, the conductive feature 216 may be a sixth via extending in the Z2 direction and only pass through the semiconductor substrate 15, so as to connect the transistor MM of the bit line decoder 40. The Z2 direction is antiparallel to the Z1 direction. Furthermore, the conductive features 216 are all the same length. In the layout of the interconnect structure 210, the conductive features 216 are arranged in a first line and the conductive features 212 are arranged in a second line. The second line is perpendicular to the first line.

In some embodiments, a source line decoder (not shown) is formed under the semiconductor substrate 15, and an interconnect structure (not shown) is configured to connect the sub-source lines of the interconnect structure 20 to the source line decoder passing through the semiconductor substrate 15. The interconnected structure coupled to the source line decoder has a configuration similar to the interconnect structure 210.

In some embodiments, the source line decoder is formed under the semiconductor substrate 15, and a first interconnect structure (not shown) is formed on opposite sides of the memory cell array 10 and configured to connect the sub-source lines to the memory cell array 10. Moreover, a second interconnect structure (not shown) is formed over the first interconnect structure and is configured to connect the sub-source lines from the first interconnect structure to the source line decoder passing through the semiconductor substrate 15. The first interconnected structure has a configuration similar to the interconnect structure 20, and the second interconnected structure has a configuration similar to the interconnect structure 210.

In the interconnect structure 20 of FIG. 8, the area of the sub-bit line in each level that is not overlapped by the upper layer, is large enough to accommodate the conductive features 212. Thus, the pitch width between the conductive feature 212 is enough to meet IC processing requirements, i.e., it does not affect the critical dimension (CD) of the IC. Furthermore, the pitch width between the two adjacent conductive features 216 needs to be designed to meet IC processing requirements.

Figure 9:
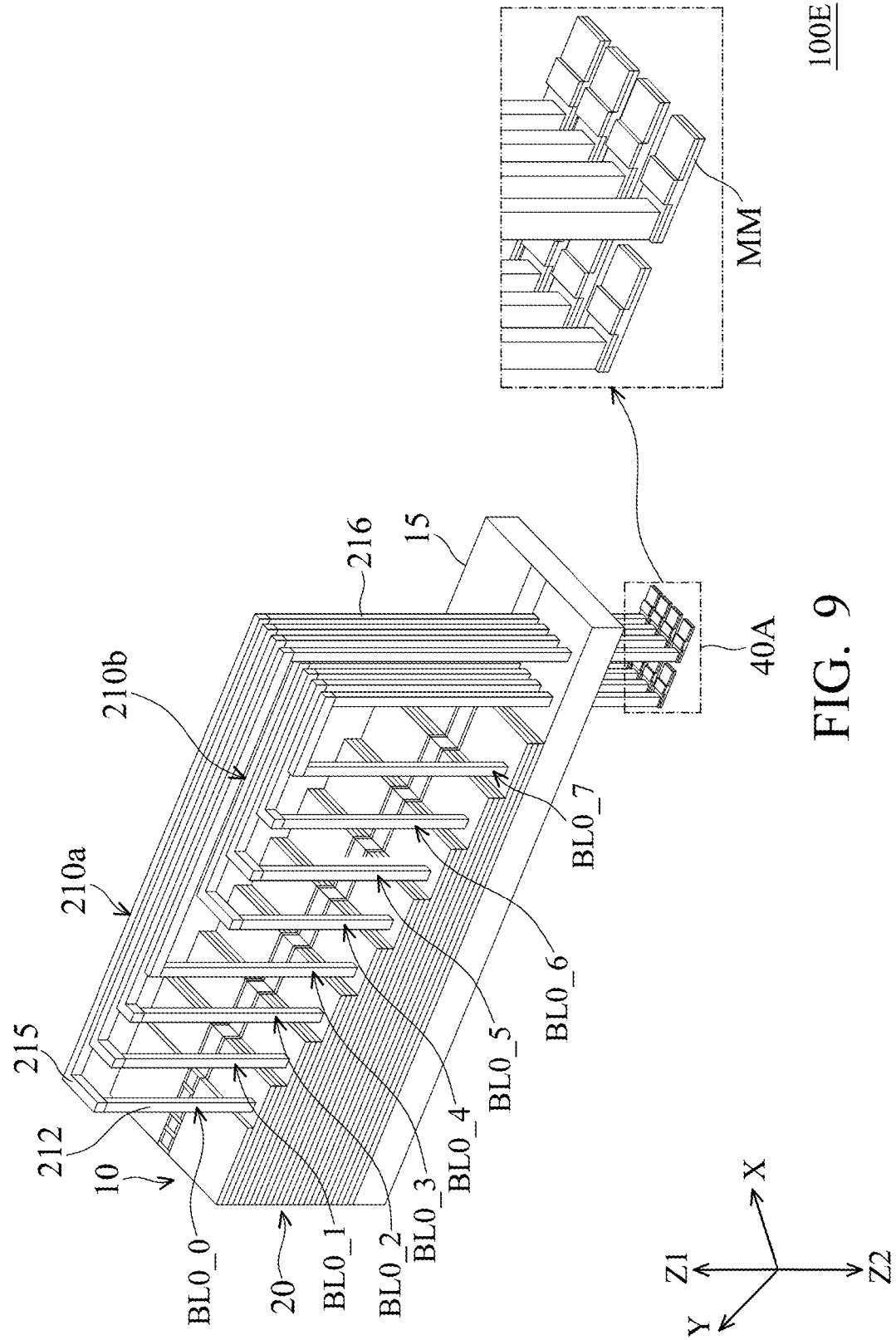
FIG. 9 shows a stereoscopic view of a three-dimensional memory, in accordance with some embodiments of the disclosure.

FIG. 9 shows a stereoscopic view of a three-dimensional memory 100E, in accordance with some embodiments of the disclosure. The three-dimensional memory 100E of FIG. 9 has a similar configuration to the three-dimensional memory 100D of FIG. 8. The difference between the three-dimensional memory 100D of FIG. 8 and the three-dimensional memory 100E of FIG. 9 is that the sub-bit lines BL0_0 through BL0_7 are coupled to the bit line decoder 40A through the interconnect structures 210a and 210b. For example, the sub-bit lines BL0_0 through BL0_3 are coupled to the bit line decoder 40A through the interconnect structure 210a, and the sub-bit lines BL0_4 through BL0_7 are coupled to the bit line decoder 40A through the interconnect structure 210b.

The interconnect structures 210a and 210b have the configuration similar to the interconnect structure 210 of FIG. 8. The conductive features 215 of the interconnect structure 210a are formed in a higher level, and the conductive features 215 of the interconnect structure 210b are formed in a lower level. The interconnect structure 210b is surrounded by the interconnect structure 210a. In the layout of the interconnect structures 210a and 210b, the conductive features 212 of the interconnect structures 210a and 210b are arranged in a first line. Moreover, the conductive features 216 of the interconnect structure 210a are arranged in a second line, and the conductive features 216 of the interconnect structure 210b are arranged in a third line parallel to the second line. The first line is perpendicular to the second and third line.

Compared with the three-dimensional memory 100D of FIG. 8, the three-dimensional memory 100E of FIG. 9 is capable of providing more levels in the interconnect structure 20 (i.e., the sub-bit lines are increased) because the arrangement of the conductive features 216 of the interconnect structures 210a and 210b will not be limited by the pitch width of the conductive features 216. The pitch widths of the conductive features 212 and 216 are not be limited by size of the exposed area of the sub-bit/sub-source line in each level that are not overlapped by the upper layer, and the three-dimensional memory 100D may be a high-density memory with numerous bit lines and source lines or with numerous sub-bit lines and sub-source lines. The high-density memory is a three-dimensional memory having high bandwidth, lower cost, and higher capacity.

In some embodiments, a source line decoder (not shown) is formed under the semiconductor substrate 15, and at least two interconnect structures (not shown) are configured to connect the sub-source lines of the interconnect structure 20 to the source line decoder passing through the semiconductor substrate 15. The interconnected structures coupled to the source line decoder have the configuration similar to the interconnect structures 210a and 210b.

In some embodiments, the source line decoder is formed under the semiconductor substrate 15, and a first interconnect structure (not shown) is formed on opposite sides of the memory cell array 10 and configured to connect the sub-source lines to the memory cell array 10. Moreover, at least two second interconnect structures (not shown) are formed over the first interconnect structure and is configured to connect the sub-source lines from the first interconnect structure to the source line decoder passing through only the semiconductor substrate 15. The first interconnected structure has a configuration similar to the interconnect structure 20, and the second interconnected structures have the configuration similar to the interconnect structures 210*a* and 210*b*.

Figure 10:
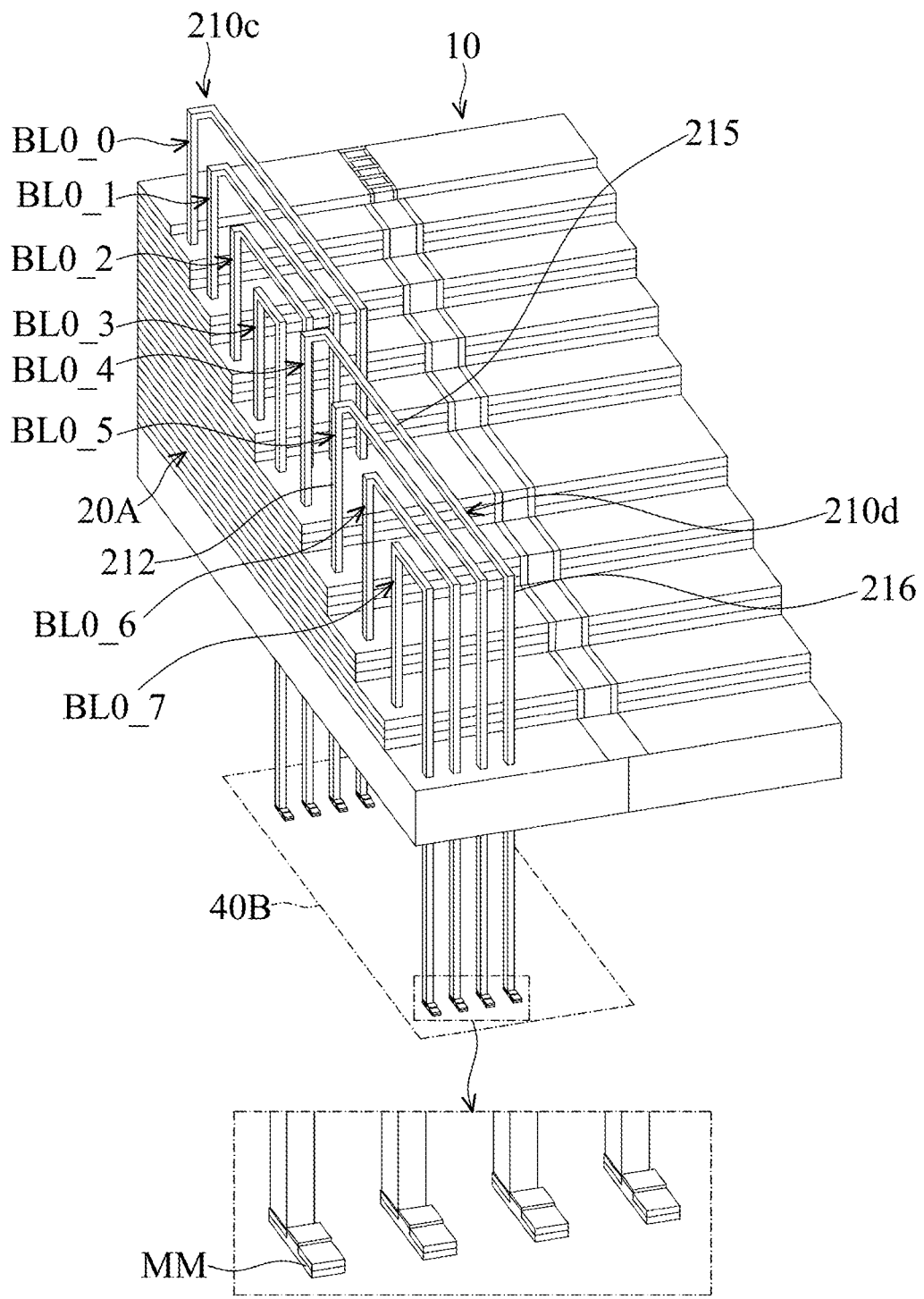
FIG. 10 shows a stereoscopic view of a three-dimensional memory 100F, in accordance with some embodiments of the disclosure.

FIG. 10 shows a stereoscopic view of a three-dimensional memory 100F, in accordance with some embodiments of the disclosure. The three-dimensional memory 100F of FIG. 10 has a similar configuration to the three-dimensional memory 100D of FIG. 8. The difference between the three-dimensional memory 100D of FIG. 8 and the three-dimensional memory 100F of FIG. 10 is that the interconnect structure 210*c* is configured to coupled the sub-bit lines BL0_0 through BL0_3 to the bit line decoder 40B passing through the interconnect structure 20A and the semiconductor substrate 15, and the interconnect structure 210*d* is configured to coupled the sub-bit lines BL0_4 through BL0_7 to the bit line decoder 40B only passing through the semiconductor substrate 15.

The interconnect structures 210*c* and 210*d* have the configuration similar to the interconnect structure 210 of FIG. 8. The conductive features 215 of the interconnect structure 210*c* and the interconnect structure 210*d* are formed in the same level. In the layout of the interconnect structures 210*c* and 210*d*, the conductive features 212 of the interconnect structures 210*c* and 210*d* are arranged in a line. Moreover, the conductive features 216 of the interconnect structure 210*c* are arranged in a first line, and the conductive features 216 of the interconnect structure 210*d* are arranged in a second line parallel with the first line. In some embodiments, a distance between the first and second lines is greater than the pitch width of the conductive features 212.

In the interconnect structure 20A, the exposed areas of the sub-bit lines BL0_0 through BL0_3 and BL0_5 through BL0_7 in the levels that are not overlapped by the upper layer, are the same. In the sub-bit line BL0_4, the conductive feature 212 of the interconnect structure 210*d* is in contact with the sub-bit line BL0_4. Furthermore, the conductive features 216 of the interconnect structure 210*c* pass through the interconnect structure 20A and the semiconductor substrate 15 from the sub-bit line BL0_4. The exposed area of the sub-bit line BL0_4 in the level that is not overlapped by the upper layer has a larger area, so as to better place the conductive feature 212 of the interconnect structure 210*d* and the conductive features 216 of the interconnect structure 210*c* in the layout. Moreover, an isolation material is formed between the interconnect structure 20A and the conductive features 216 of the interconnect structure 210*c*.

Compared with the three-dimensional memory 100D of FIG. 8, the three-dimensional memory 100F of FIG. 10 is capable of providing more levels (i.e. high density) in the interconnect structure 20 (i.e., the sub-bit lines are increased) because the arrangement of the conductive features 216 of the interconnect structures 210*c* and 210*d* will not be limited by the pitch width of the conductive features 216. The pitch widths of the conductive features 212 and 216 are not be limited by size of the exposed area of the sub-bit/sub-source line in each level that are not overlapped by the upper layer, and the three-dimensional memory 100E may be a high-density memory with numerous bit lines and source lines or with numerous sub-bit lines and sub-source lines. The high-density memory is a three-dimensional memory having high bandwidth, lower cost, and higher capacity.

In some embodiments, a source line decoder (not shown) is formed under the semiconductor substrate 15, and at least two interconnect structures (not shown) are configured to connect the sub-source lines of the interconnect structure 20A to the source line decoder passing through the semiconductor substrate 15. The interconnected structure passing through the interconnect structure 20A and the semiconductor substrate 15 is configured to couple the source line decoder, and has the configuration similar to the interconnect structure 210*c*. Moreover, the interconnected structure only passing through the semiconductor substrate 15 is configured to couple the source line decoder, and has the configuration similar to the interconnect structure 210*d*.

In some embodiments, the source line decoder is formed under the semiconductor substrate 15, and a first interconnect structure (not shown) is formed on opposite sides of the memory cell array 10 and configured to connect the sub-source lines to the memory cell array 10. Moreover, at least two second interconnect structures (not shown) are formed over the first interconnect structure and is configured to connect the sub-source lines from the first interconnect structure to the source line decoder passing through the semiconductor substrate 15. One of the second interconnected structure passing through the interconnect structure 20A and the semiconductor substrate 15 to couple the source line decoder, has the configuration similar to the interconnect structure 210*c*. Moreover, the other second interconnected structure only passing through the semiconductor substrate 15 to couple the source line decoder, has the configuration similar to the interconnect structure 210*d*.

Embodiments of three-dimensional memories for high-density memory are provided. The three-dimensional memory includes a memory cell array with multiple level stacked, and each level includes multiple memory cells 30. The memory cell may include a GAA nanowire or nanosheet transistor. In each level, the memory cells 30 are arranged in multiple parallel lines. The source lines and the bit lines of the memory cells 30 are coupled to the related decoder under the memory cell array through the interconnect structure (or hookup structure). The interconnect structure includes the three conductive features, such as the conductive features 112, 115 and 116 of the interconnect structure 110, the conductive features 114, 117 and 118 of the interconnect structure 130 or the conductive features 212, 215 and 216 in FIGS. 8, 9 and 10). By using the conductive features to connect the memory cell array to the related decoder, the metal routing complexity is decreased, and RC value is decreased in the interconnect structure due to the shorter conductive path between the memory cell array and the related decoder. Furthermore, the pitch widths of the conductive features are not be limited by size of the bit/source line, thereby obtaining a high-density memory with numerous bit lines and numerous source lines.

In some embodiments, a three-dimensional memory is provided. The three-dimensional memory includes a memory cell array, a first interconnect structure, a bit line decoder, and a second interconnect structure. The memory cell array includes a plurality of memory cells formed in a plurality of levels stacked in a first direction. The first interconnect structure is formed on one side of the memory cell array. The first interconnect structure includes at least one bit line extending in a second direction that is perpendicular to the first direction. The bit line includes a plurality of sub-bit lines stacked in the first direction, and each of the sub-bit lines is coupled to the memory cells arranged in a line in the corresponding level of the memory cell array. The bit line decoder is formed under the memory cell array and the first interconnect structure. The second interconnect structure is configured to connect the bit line to the bit line decoder passing through the first interconnect structure.

In some embodiments, a three-dimensional memory is provided. The three-dimensional memory includes a semiconductor substrate, a memory cell array, a first interconnect structure, a bit line decoder, and a second interconnect structure. The memory cell array is formed over the first area of the semiconductor substrate. The memory cell array includes a plurality of memory cells formed in a plurality of levels stacked in a first direction. The first interconnect structure is formed over the first area of the semiconductor substrate and on one side of the memory cell array. The first interconnect structure includes at least one bit line extending in a second direction that is perpendicular to the first direction. The bit line includes a plurality of sub-bit lines stacked in the first direction, and each of the sub-bit lines is coupled to the memory cells arranged in a line in the corresponding level of the memory cell array. The bit line decoder is formed under the semiconductor substrate. The second interconnect structure is configured to connect the bit line to the bit line decoder passing through the second area of the semiconductor substrate.

In some embodiments, a three-dimensional memory is provided. The three-dimensional memory includes a semiconductor substrate, a memory cell array, a first interconnect structure, a bit line decoder, a second interconnect structure, and a third interconnect structure. The memory cell array is formed over the first area of the semiconductor substrate. The memory cell array includes a plurality of memory cells formed in a plurality of levels stacked in a first direction. The first interconnect structure is formed over the first area of the semiconductor substrate on one side of the memory cell array. The first interconnect structure includes at least one bit line extending in a second direction that is perpendicular to the first direction. The bit line includes a plurality of sub-bit lines stacked in the first direction, and each of the sub-bit lines is coupled to the memory cells arranged in a line in the corresponding level. The bit line decoder is formed under the memory cell array and the first interconnect structure. The second interconnect structure is configured to connect a partition of the sub-bit lines of the bit line to the bit line decoder passing through the second area of the semiconductor substrate. The third interconnect structure is configured to connect the remaining sub-bit lines of the bit line to the bit line decoder passing through the first area of the semiconductor substrate.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional memory, comprising:
   a memory cell array comprising a plurality of memory cells formed in a plurality of levels stacked in a first direction;
   a first interconnect structure formed on one side of the memory cell array, and comprising:
      at least one bit line extending in a second direction that is perpendicular to the first direction, wherein the bit line comprises a plurality of sub-bit lines stacked in the first direction, and each of the sub-bit lines is coupled to the memory cells arranged in a line in the corresponding level of the memory cell array;
   a bit line decoder formed under the memory cell array and the first interconnect structure; and
   a second interconnect structure configured to connect the bit line to the bit line decoder passing through the first interconnect structure.

2. The three-dimensional memory as claimed in claim 1, wherein the second interconnect structure comprises:
   a plurality of first conductive features extending in the first direction, wherein each of the first conductive features is in contact with the corresponding sub-bit line;
   a plurality of second conductive features formed in a level over the memory cell array and extending in a third direction that is perpendicular to the first and second directions; and
   a plurality of third conductive features extending in a fourth direction to the bit line decoder passing through the first interconnect structure, wherein the fourth direction is antiparallel to the first direction,
   wherein the first conductive features are coupled to the third conductive features through the second conductive features.

3. The three-dimensional memory as claimed in claim 2, wherein the second interconnect structure further comprises:
   an isolation material formed between the third conductive features and the first interconnect structure.

4. The three-dimensional memory as claimed in claim 1, wherein the first interconnect structure further comprises:
   at least one source line extending in the second direction, wherein the source line comprises a plurality of sub-source lines stacked in the first direction, and each of the sub-source lines is coupled to the memory cells arranged in a line in the corresponding level of the memory cell array.

5. The three-dimensional memory as claimed in claim 4, further comprising:
   a source line decoder formed under the memory cell array and the first interconnect structure; and
   a third interconnect structure configured to connect the source line to the source line decoder passing through the first interconnect structure.

6. The three-dimensional memory as claimed in claim 1, further comprising:
   a fourth interconnect structure formed on the opposite side of the memory cell array, and comprising:
      at least one source line extending in the second direction, wherein the source line comprises a plurality of sub-source lines stacked in the first direction, and each of the sub-source lines is coupled to the memory cells that are arranged in a line in the corresponding level of the memory cell array;
   a source line decoder formed under the memory cell array and the fourth interconnect structure; and a fifth interconnect structure configured to connect the source line to the source line decoder passing through the fourth interconnect structure.

7. The three-dimensional memory as claimed in claim 1, wherein the second interconnect structure comprises:
    a plurality of first conductive features extending in the first direction, wherein each of the first conductive features is in contact with the corresponding sub-bit line;
    a plurality of second conductive features formed in a level over the memory cell array and extending in the second direction;
    a plurality of third conductive features extending in a third direction to the bit line decoder passing through the first interconnect structure, wherein the third direction is antiparallel to the first direction,
    wherein the first conductive features are coupled to the third conductive features through the second conductive features.

8. The three-dimensional memory as claimed in claim 7, wherein the second interconnect structure further comprises:
    an isolation material formed between the third conductive features and the first interconnect structure.

9. The three-dimensional memory as claimed in claim 1, further comprising:
    a plurality of word lines under or over the memory cell array, wherein the word lines extend in a fifth direction that is perpendicular to the first and second directions.

10. A three-dimensional memory, comprising:
    a semiconductor substrate;
    a memory cell array formed over a first area of the semiconductor substrate and comprising a plurality of memory cells formed in a plurality of levels stacked in a first direction;
    a first interconnect structure formed over the first area of the semiconductor substrate and on one side of the memory cell array, and comprising:
        at least one bit line extending in a second direction that is perpendicular to the first direction, wherein the bit line comprises a plurality of sub-bit lines stacked in the first direction, and each of the sub-bit lines is coupled to the memory cells arranged in a line in the corresponding level of the memory cell array;
    a bit line decoder formed under the semiconductor substrate; and
    a second interconnect structure configured to connect the bit line to the bit line decoder passing through a second area of the semiconductor substrate.

11. The three-dimensional memory as claimed in claim 10, wherein the second interconnect structure comprises:
    a plurality of first conductive features extending in the first direction, wherein each of the first conductive features is in contact with the corresponding sub-bit line;
    a plurality of second conductive features formed in a level over the memory cell array; and
    a plurality of third conductive features extending in a third direction to the bit line decoder passing through the second area of the semiconductor substrate, wherein the third direction is antiparallel to the first direction,
    wherein the first conductive features are coupled to the third conductive features through the second conductive features.

12. The three-dimensional memory as claimed in claim 11, wherein the number of the third conductive features is equal to the number of sub-bit lines.

13. The three-dimensional memory as claimed in claim 10, further comprising:
    a source line decoder formed under the semiconductor substrate; and
    a third interconnect structure configured to connect at least one source line of the first interconnect structure to the source line decoder passing through the second area of the semiconductor substrate,
    wherein the source line extend in the second direction,
    wherein the source line comprises a plurality of sub-source lines stacked in the first direction, and each of the sub-source lines is coupled to the memory cells arranged in a line in the corresponding level.

14. The three-dimensional memory as claimed in claim 13, wherein in each of the levels of the memory cell array, the memory cells are arranged in a plurality of lines, and the sub-bit lines and the sub-source lines are alternately arranged between two adjacent lines.

15. The three-dimensional memory as claimed in claim 10, wherein the second interconnect structure comprises:
    a first sub-structure configured to connect a plurality of sub-bit lines of the bit line to the bit line decoder passing through the second area of the semiconductor substrate; and
    a second sub-structure configured to connect the remaining sub-bit lines of the bit line to the bit line decoder passing through the second area of the semiconductor substrate.

16. The three-dimensional memory as claimed in claim 15, wherein each of the first and second sub-structures comprises:
    a plurality of first conductive features extending in the first direction, wherein each of the first conductive features is in contact with the corresponding sub-bit line;
    a plurality of second conductive features formed over the memory cell array; and
    a plurality of third conductive features extending in a third direction to the bit line decoder passing through the second area of the semiconductor substrate, wherein the third direction is antiparallel to the first direction,
    wherein the first conductive features are coupled to the third conductive features through the second conductive features.

17. The three-dimensional memory as claimed in claim 16, wherein the second conductive features of the first sub-structure are formed in a first level, and the second conductive features of the second sub-structure are formed in a second level over the first level.

18. A three-dimensional memory, comprising:
    a semiconductor substrate;
    a memory cell array formed over a first area of the semiconductor substrate and comprising a plurality of memory cells formed in a plurality of levels stacked in a first direction;
    a first interconnect structure formed over the first area of the semiconductor substrate on one side of the memory cell array, and comprising:
        at least one bit line extending in a second direction that is perpendicular to the first direction, wherein the bit line comprises a plurality of sub-bit lines stacked in the first direction, and each of the sub-bit lines is coupled to the memory cells arranged in a line in the corresponding level;
    a bit line decoder formed under the memory cell array and the first interconnect structure;

a second interconnect structure configured to connect a partition of the sub-bit lines of the bit line to the bit line decoder passing through a second area of the semiconductor substrate; and a third interconnect structure configured to connect the remaining sub-bit lines of the bit line to the bit line decoder passing through the first area of the semiconductor substrate.

19. The three-dimensional memory as claimed in claim 18, wherein the second interconnect structure comprises:
   a plurality of first conductive features extending in the first direction, wherein each of the first conductive features is in contact with the corresponding sub-bit line;
   a plurality of second conductive features formed in a first level over the memory cell array; and
   a plurality of third conductive features extending in a third direction to the bit line decoder passing through the second area of the semiconductor substrate, wherein the third direction is antiparallel to the first direction,
   wherein the first conductive features are coupled to the third conductive features through the second conductive features.

20. The three-dimensional memory as claimed in claim 19, wherein the third interconnect structure comprises:
   a plurality of fourth conductive features extending in the first direction, wherein each of the fourth conductive features is in contact with the corresponding sub-bit line;
   a plurality of fifth conductive features formed in the first level; and
   a plurality of sixth conductive features extending in the third direction to the bit line decoder passing through the first interconnect structure at one of the sub-bit lines of the first interconnect structure,
   wherein the fourth conductive features are coupled to the sixth conductive features through the fifth conductive features,
   wherein the one of the sub-bit lines has a larger area than the other sub-bit lines.

\* \* \* \* \*